(12) United States Patent
Stine

(10) Patent No.: US 6,701,140 B1
(45) Date of Patent: Mar. 2, 2004

(54) DIGITAL RECEIVE PHASE LOCK LOOP WITH CUMULATIVE PHASE ERROR CORRECTION AND DYNAMICALLY PROGRAMMABLE CORRECTION RATE

(75) Inventor: Eric Stine, Collegeville, PA (US)

(73) Assignee: 3Com Corporation, Santa Clara, CA (US)

( * ) Notice: Subject to any disclaimer, the term of this patent is extended or adjusted under 35 U.S.C. 154(b) by 279 days.

(21) Appl. No.: 09/661,691

(22) Filed: Sep. 14, 2000

(51) Int. Cl.[7] ................................................ H03L 7/06
(52) U.S. Cl. ........................ 455/260; 455/265; 375/327; 375/364; 375/371; 375/376
(58) Field of Search .......................... 455/255, 258–260, 455/265; 375/327, 344, 364, 371, 376

(56) References Cited

U.S. PATENT DOCUMENTS

| | | | | |
|---|---|---|---|---|
| 5,811,998 A | * | 9/1998 | Lundberg et al. ............ | 327/156 |
| 5,812,619 A | * | 9/1998 | Runaldue ..................... | 375/376 |
| 5,896,067 A | * | 4/1999 | Williams ..................... | 331/17 |
| 5,943,378 A | * | 8/1999 | Keba ........................... | 375/373 |
| 6,282,042 B1 | * | 8/2001 | Hana ........................... | 360/64 |

* cited by examiner

Primary Examiner—William Trost
Assistant Examiner—Brandon Miller
(74) Attorney, Agent, or Firm—Michaelson & Associates; Peter L. Michaelson; George Wolken, Jr.

(57) ABSTRACT

A digital phase lock loop (PLL) for maintaining synchronization with the phase of a received data signal including a preamble and an information-containing data frame, by incrementing a state machine through an internal cyclic count, each cycle thereof including a center count tending to coincide with center regions of the successive pulses and an edge count tending to coincide with edges of the successive pulses. The PLL selects a current sample of the signal whenever the internal count reaches the predetermined center count value. The state machine internal count is updated in accordance with a cumulative phase error obtained by summing the phase errors detected over successive edges between each edge and the corresponding center count. The interval over which the cumulative phase error is computed depends upon the number of received edges during the preamble and depends upon elapsed time during the data frame.

44 Claims, 9 Drawing Sheets

| STATE MACHINE COUNT | 3 | 2 | 1 | 0 | 7 | 6 | 5 | 4 | 3 | 2 | 1 | 0 | 7 | 6 | 5 | 4 | 3 | 1 | 0 | 7 |
|---|---|---|---|---|---|---|---|---|---|---|---|---|---|---|---|---|---|---|---|---|
| EDGE DETECTED | 1 | 0 | 0 | 0 | 0 | 0 | 0 | 1 | 0 | 0 | 0 | 0 | 0 | 0 | 0 | 1 | 0 | 0 | | |
| DETECTED PHASE ERROR | 0 | | | | | | | +2 | | | | | | | | +1 | | | | |
| CUMULATIVE ERROR | | | | | | | | +2 | | | | | | | | +3 | | | | |
| NO. OF EDGES PER CORRECTION CYCLE | 2 | | | | | | | | | | | | | | | | | | | |
| RESIDUAL ERROR AFTER CORRECTION | 0 | | | | | | | | | | | | | | | 1 | | | | |

← ONE CORRECTION CYCLE →

FIRST STATE MACHINE CYCLE ― SECOND STATE MACHINE COUNT CYCLE

FIG. 9

DIGITAL RECEIVE PHASE LOCK LOOP WITH CUMULATIVE PHASE ERROR CORRECTION AND DYNAMICALLY PROGRAMMABLE CORRECTION RATE

BACKGROUND OF THE INVENTION

1. Technical Field

The invention is related to digital communication devices and in particular to a receive digital phase lock loop.

2. Background Art

Digital communications such as those provided in a wide area network (WAN) or local area network (LAN) of personal computers (for example) are constantly being improved to operate at higher data rates. For example, there is considerable interest in developing networks capable of operating at a clock frequency of 10 MHz, corresponding to a pulse width of 50 nanoseconds (nS). Preferably, the data transmitted on the network is Manchester encoded. The problem with such a high data rate (narrow pulse width) is that the system is particularly susceptible to failure due to distortion of the data stream inherent in any transmission medium, such as cables running between offices in a large building for example. The speed at which the data-containing signal travels through the cable is affected by a number of things including stray capacitances that can vary depending upon surrounding conditions. Such changes cause the signal's speed to vary. Such variations cause jitter in the received signal, in which the time between successive pulses observed at a receiving point in the network fluctuates, causing the apparent position of each pulse to drift. If this drift becomes excessive, the receiving device cannot maintain synchronization between the incoming data stream and its own clock, leading to complete loss of the received signal. For a typical cable, the drift induced by jitter can be exceed 10 nS and can be as great as 13.5 nS. For older systems that operate at lower frequencies (and therefore larger pulse widths), this does not pose a significant problem. However, a 13.5 nS drift in a high-speed system in which the pulse width is only 50 nS, for example, often causes loss of synchronization and therefore failure.

Typically, a digital phase lock loop (PLL) operating at a clock rate many times the frequency of the incoming data maintains synchronization between the incoming data and the receiver, so that the receiver takes only a narrow sample of each pulse near the center of the pulse or at least well away from either edge of the pulse. The time at which each data sample is taken (the data sample point) is controlled by the PLL. The goal of the phase lock loop is to follow the drift in the received signal so as to keep the data sample point in the middle of each successive pulse. I previously developed a high speed digital PLL having a phase error counter and an edge counter. The edge counter counts the number of edges and indicates when the phase lock loop should update its data sample point. The phase error counter tracks the phase of the incoming signal relative to the PLL's current sample data point, and periodically updates this point. At the update time, the phase error counter polarity indicates whether to advance or retard the data sample point by one clock. Upon making this correction, both the phase error counter and the edge counter are cleared, and the process is restarted.

I found that the foregoing architecture, when applied to data having a frequency of 10 MHz, was inadequate to withstand jitter of well over 10 nS, e.g., jitter of 13.5 nS. That is, the architecture was susceptible to synchronization loss in the presence of jitter of 13.5 nS. Since this amount of jitter can be expected in many applications, it is a goal of the present invention to improve this architecture to the point that it can reliably maintain synchronization of 10 MHz data in the presence of 13.5 nS jitter.

One problem with the foregoing architecture is that the selection of the time between updates necessarily involves a tradeoff between two constraints. One constraint is that each block of data is preceded by a preamble of successive uniform pulses, typically about 56 pulses, during which synchronization must be attained before the actual data stream begins. This requirement demands minimizing the time between updates so that the PLL achieves synchronization as quickly as possible. The other constraint is that the PLL be stable and not'susceptible to a temporary phase deviation in the incoming data. This latter requirement demands maximizing the time between updates so that the PLL is fairly insensitive to temporary phase deviations. Thus, it does not appear both requirements can be met together. It is therefore another goal of the invention to establish synchronization very quickly—before the end of the preamble—without sacrificing stability of the PLL.

SUMMARY OF THE INVENTION

A digital phase lock loop (PLL) for maintaining synchronization with the phase of a received data signal including a preamble and an information-containing data frame, by incrementing a state machine through an internal cyclic count, each cycle thereof including a center count tending to coincide with center regions of the successive pulses and an edge count tending to coincide with edges of the successive pulses. The PLL selects a current sample of the signal whenever the internal count reaches the predetermined center count value. The state machine internal count is updated in accordance with a cumulative phase error obtained by summing the phase errors detected over successive edges between each edge and the corresponding center count. The interval over which the cumulative phase error is computed depends upon the number of received edges during the preamble and depends upon elapsed time during the data frame. The advantage is that the interval can be very short during the initial portion of the preamble so that synchronization is obtained quickly before the end of the preamble while the interval is longer during the data frame to optimize stability after synchronization has already been attained.

In addition, during the preamble, as the PLL approaches synchronization, the number of edges in each interval may be increased over successive intervals to increase system stability. For example, starting with a minimum number of edges (2), the number of edges per interval may double with each successive interval. Preferably, during the data frame, the interval is a constant time duration which is very long relative to the intervals selected during the preamble.

BRIEF DESCRIPTION OF THE DRAWINGS

FIG. 9 is a chart illustrating an example of the computation of the residual phase error in the embodiment of FIG. 8 over two correction cycles.

DETAILED DESCRIPTION OF THE PREFERRED EMBODIMENTS

System Overview

Figure 1:
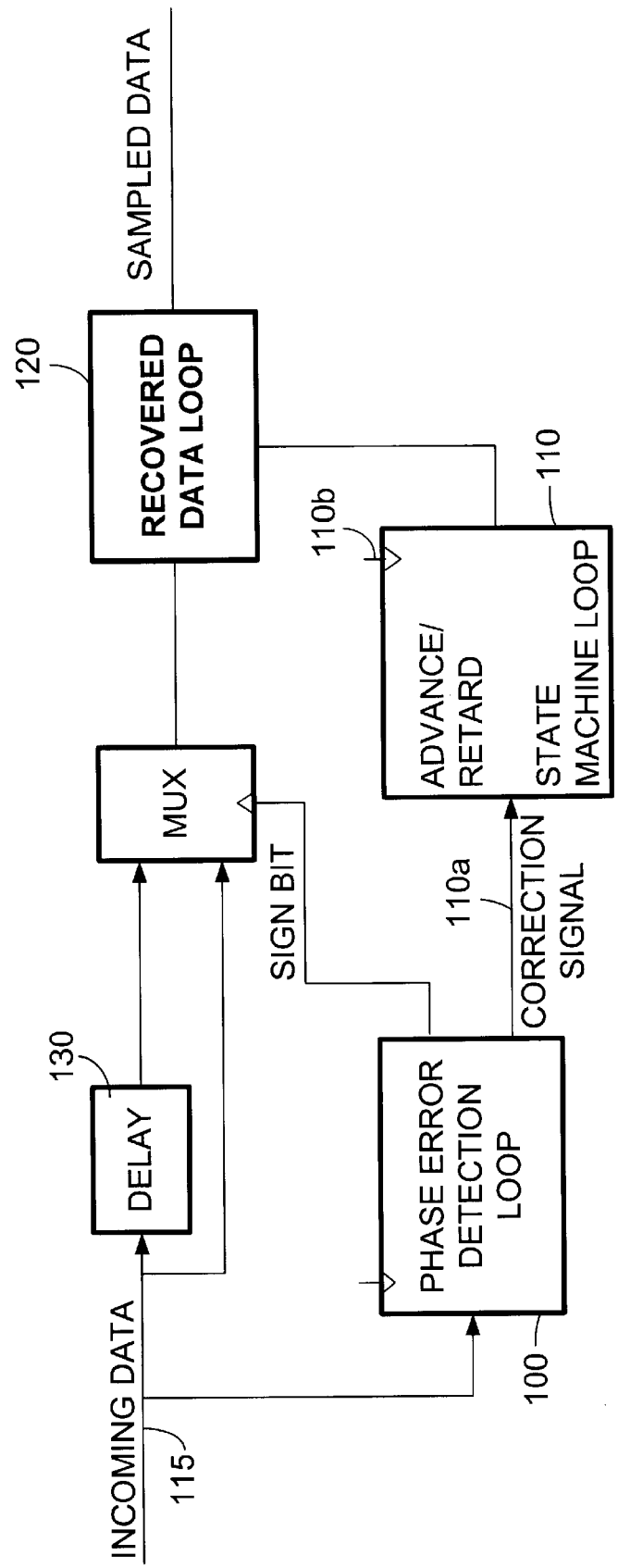
FIG. 1 is a simplified block diagram illustrating a first embodiment of the invention in which the sample data point selected by a PLL is shifted forward or backward by one clock depending upon the polarity of the detected phase error.

FIG. 1 is a highly simplified block diagram illustrating a digital PLL system. The PLL includes a phase error detection loop 100 and a state machine loop 110. An incoming data signal such as Manchester encoded data is received at an input 115., The state machine loop determines when recovered data loop 120 takes a narrow sample of each pulse in the incoming data signal. The goal is for each sample to be taken at a data sample point as close to the middle of each pulse as possible. The phase error detection loop measures the error between the data sample point defined by the state machine loop 110 and the actual middle point of the pulse. This error produces a correction signal applied to an ADVANCE/RETARD input 110a of the state machine loop 110. While the entire phase error may be applied to the ADVANCE/RETARD input 110a to produce a complete correction, this may reduce the stability of the PLL. Therefore, it is preferred that the correction to the state machine loop be less than the entire measured phase error, and preferably the correction is a minimal change in the state machine loop 110 which either advances or retards the state machine loop 110 by one clock depending upon the sign of the phase error. Thus, the PLL of FIG. 1 is self-correcting and, after a number of corrections, tends to take a narrow sample of each pulse in the incoming data signal near the middle of the pulse.

Figure 2:
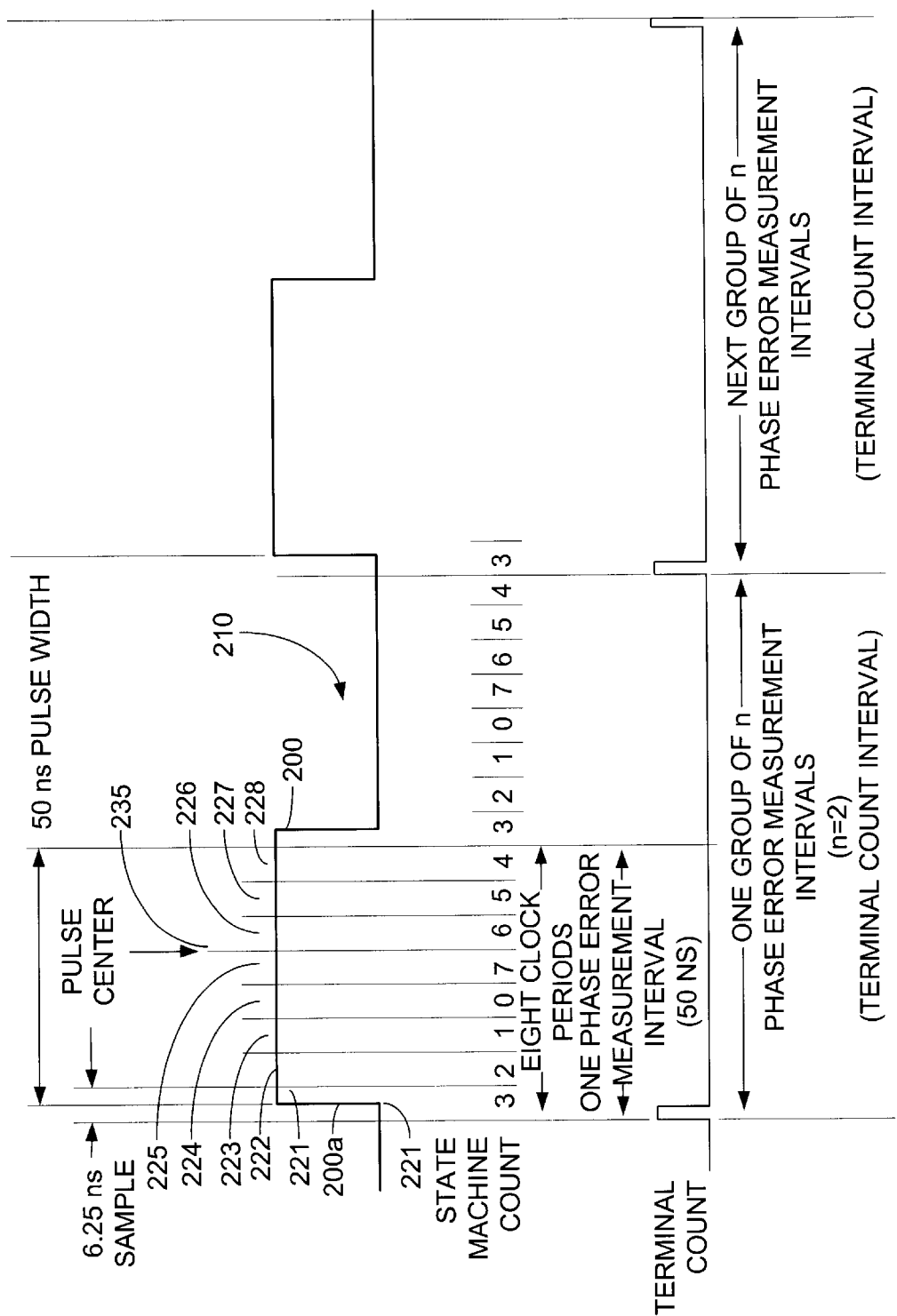
FIG. 2 is a graph of a time domain waveform illustrating the operation of the embodiment of FIG. 1.

The state machine loop 110 is synchronized with a clock signal applied to its clock input 110b, the clock signal having a frequency exceeding the pulse rate of the incoming data signal received at data signal input 115 by a factor M, where M is preferably eight in one embodiment. Thus, there are preferably 8 clock periods for each incoming pulse, each clock period corresponding to a narrow sample of the pulse so that there are eight samples of the pulse. This is illustrated in FIG. 2, in which each pulse 200 of the incoming data signal 210 is divided into eight samples 221–228 corresponding to the eight clock periods. The state machine loop 110 determines one of the eight clock periods in which the recovered data loop 120 samples the incoming data signal. The goal is for the recovered data loop 120 to sample each pulse of the incoming data signal at or near in the middle of the pulse, in order to select the sample closest to the center point 235 of the pulse of FIG. 2. The phase error detection loop 100 measures the phase error between selected sample and the pulse center 235.

The state machine loop 110 assigns to each successive clock period a "count" internal to the state machine loop 110 and increments the count by one with each clock period, so that there are eight counts for each pulse of incoming data. One obvious scheme would be to begin the count at zero upon receipt of the leading edge 200a of the current pulse 200 and terminate the count at seven. However, in the preferred embodiment the clock period containing the leading edge (corresponding to the first sample 221) is count three so that the state machine counts corresponding to the eight samples 221, 222, 223, 224, 225, 226, 227 and 228 are, respectively, 3, 4, 5, 6, 7, 0, 1, and 2, as indicated in FIG. 2. As a result, if the leading edge 200a lies in the center of the first sample 221, then the pulse center point 235 lies between samples 225 and 226, i.e., between counts 7 and 6, as shown in FIG. 2. Thus, the PLL has a resolution of one clock period so that there is an uncertainty of one clock period as to the correct location of the pulse center 235. This is due at least in part to the fact that it cannot be determined whether the leading edge 200a is precisely in the center of sample 221 (count 3). Therefore, even under ideal conditions it is not known whether the pulse center 235 lies within count 7 or count 6, leading to an ambiguity of one count. A choice is therefore made between the sample of count 7 or the sample of count 6. Typically, the sample of count 7 (i.e., sample 225 of FIG. 2) is chosen.

In a preferred embodiment, the phase error detection loop 100 measures the phase error and applies only the sign bit of the phase error to the ADVANCE/RETARD input 110a of the state machine loop 110. In this way, the internal count of the state machine loop is either incremented or decremented by one count depending upon the direction of the measured phase error. The phase error detection loop 100 determines the phase error by measuring the time between the occurrence of the leading edge 200a and the time of occurrence of state machine count 3. Thus, the phase error is measured each time there is an edge In one implementation, the correction is performed at that time, so that the next count, count x, is either left as count x (if there is zero phase error), or it is renamed count x−1 (if there is negative phase error), or it is renamed count x+1 (if there is positive phase error).

In an alternative embodiment, the phase error detection loop applies not only the sign bit but also the magnitude of the measured phase error to the ADVANCE/RETARD input 110a. In this alternative embodiment, the correction to the internal count of the state machine may exceed one count, depending upon the magnitude of the phase error. As another alternative, the phase error detection loop applies only a portion of the magnitude of the measured phase error—e.g., the m least significant bits of the measured phase error—to the ADVANCE/RETARD input 110a.

Phase-Directed Sample Selection

If the incoming data signal 210 of FIG. 2 has a 10 MHz frequency, the signal 210 has a 100 nS cycle, as indicated in FIG. 2. In this case, each pulse is 50 nS wide and each of the eight samples must be 6.25 nS wide, so that the sample rate is 160 MHz, sixteen times the 10 MHz signal frequency. At such high frequencies, the presence of 13.5 nS jitter can cause loss of synchronization by the PLL. One example of loss of synchronization is failure by the phase detection loop 100 and state machine loop 110 to keep count 3 between the leading and trailing edges of the successive pulses. It is a discovery of the present invention that one factor contributing to such susceptibility to synchronization loss in the presence of jitter is the one-clock uncertainty in the position of the pulse center point 235. This is the ambiguity between the samples of counts 6 and 7. As described above, this uncertainty follows from the fact that the resolution of the PLL is no better than one clock period.

This limitation is overcome in a first embodiment of the invention by resolving the ambiguity between the two samples nominally centered about the pulse center point 235 in the absence of phase error, i.e., the samples of counts 6 and 7 in the implementation of FIG. 2. This is achieved by intelligently choosing between the samples of counts 6 and 7 by exploiting information from the phase error. Specifically, the choice is made depending upon the sign of the phase error. The result is that the margin of error of the PLL is improved by a half clock period, since on the average the choice between each one of count 6 and count 7 represents half of the total one-clock uncertainty.

This improvement is implemented in the embodiment of FIG. 1. In the digital PLL of FIG. 1, the state machine loop 110 controls the position of the sample data point by periodically correcting the state machine loop count in the manner previously described above. However, the sample ultimately selected by the PLL based upon this count is chosen from either one of the two samples (i.e., the sample of count 7 or the sample of count 6) between which the pulse center point 235 lies in the absence of phase shift error. This choice is made for each pulse depending upon the polarity of the detected phase error. This choice is implemented in accordance with a preferred implementation by interposing a delay flip-flop 130 between the incoming data signal input 115 and the recovered data loop 120. A two-input multiplexer 135 receives the undelayed data signal at one input and the delayed signal from the flip flop 130 at its other input. The output applied to the recovered data loop 120 is chosen from one of these two inputs in accordance with the sign bit of the phase error from the phase error detection loop 100 applied to the control input of the multiplexer 135 as illustrated in FIG. 1. Of course, other logic circuit designs may be employed to realize the same function, and the invention is not limited to the particular logic design illustrated in FIG. 1.

Phase Error Averaging

Figure 3:
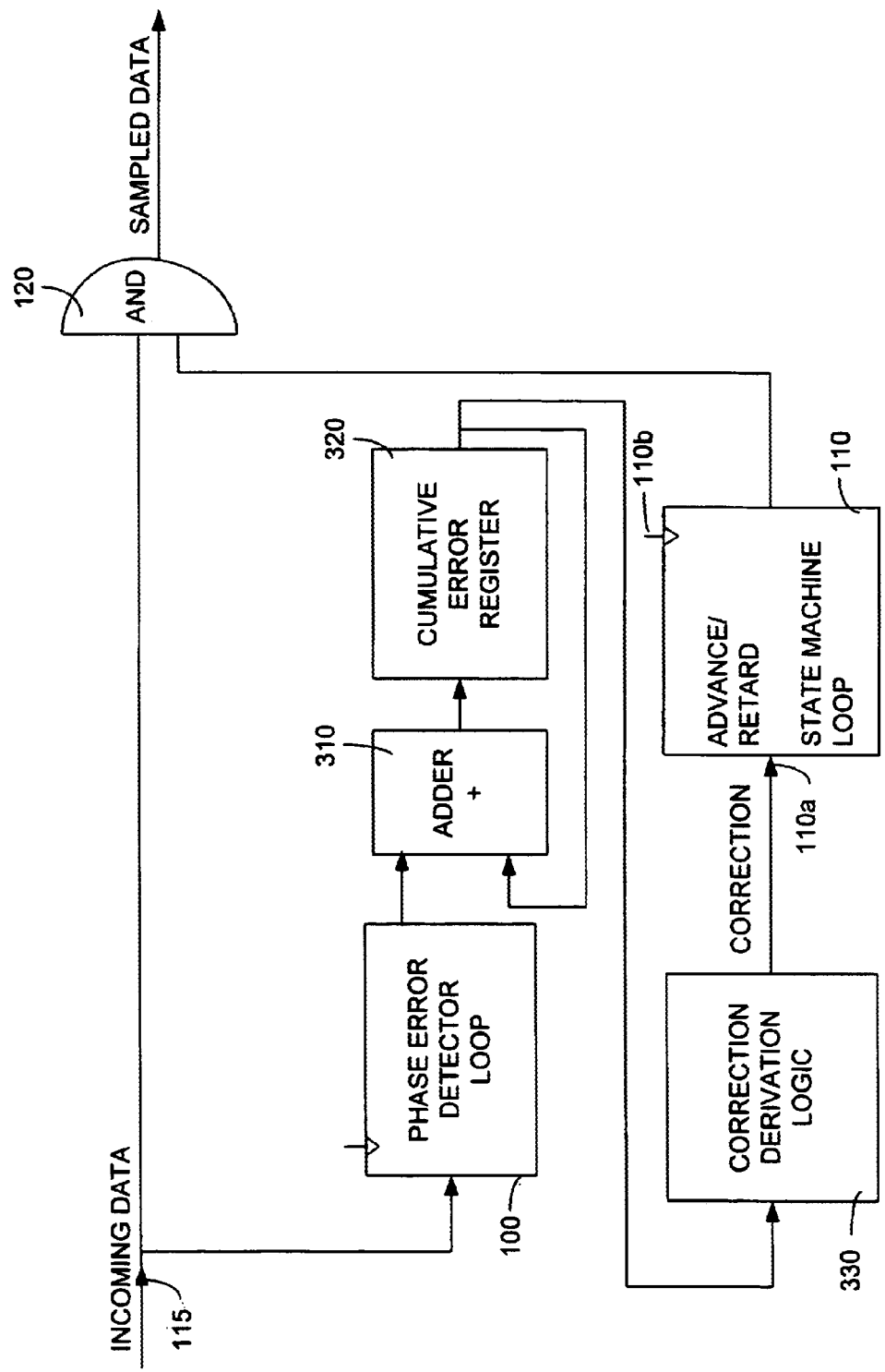
FIG. 3 is a simplified block diagram illustrating a second embodiment of the invention in which the phase error is averaged over a period of time before a correction to the PLL is determined.

In accordance with a second embodiment of the invention illustrated in FIG. 3, the PLL's stability and immunity to jitter are improved by deriving the correction to the state machine count from an average over several computations of the phase error. For example, in the implementation of FIG. 2, the phase error is measured every 50 nS (upon the occurrence of an edge) by detecting the phase difference between count 3 and the leading edge of the current pulse. The PLL stability is improved in the embodiment of FIG. 3 by retaining all of the phase errors measured during a succession of plural 50 nS phase measurement intervals. In this embodiment, the plurality of phase errors thus obtained are averaged together, and the state machine internal count is corrected (updated) in accordance with this average, rather than according to an instantaneous phase error. As a result, the performance of the PLL is less susceptible to jitter-induced temporary excursions in the phase error, a significant advantage.

As illustrated in FIG. 3, the phase error detected every 50 nS by the phase error detector loop 100 is combined by an adder 310 with the output of a cumulative phase error register 320 and the sum is applied to the input of the cumulative phase error register 300, replacing its prior contents. Thus, the cumulative phase error register 320 contains the sum of prior phase errors. After a predetermined number (n) of 50 nS phase measurement intervals, a correction is made to the state machine loop internal count. For this purpose, correction derivation logic 330 takes the total or cumulative phase error from the cumulative phase error register 320 and produces therefrom a correction signal. This correction signal is therefore based upon an ensemble or average of plural phase error measurements, and is applied to the ADVANCE/RETARD input 110a of the state machine loop 110. Preferably, this correction is applied only at the conclusion of the n of 50 nS phase measurement interval over which the average phase error is computed. Contemporaneously, the cumulative error register is reset (e.g., to zero) in preparation for the computation of the cumulative phase error over the next group of n phase measurement intervals. The timing is illustrated in FIG. 2, which indicates a first 50 nS interval of eight samples or counts as one phase error measurement interval. FIG. 2 further illustrates one group of n phase measurement intervals for n=2, spanning two 50 nS measurement intervals.

In one implementation of the embodiment of FIG. 3, the correction derivation logic 330 applies a correction signal to the ADVANCE/RETARD state machine input 110a representing the magnitude of the cumulative error divided by the number of phase measurement intervals, so that the state machine internal count is completely corrected relative to the average phase error, so that the error is zeroed out with each correction. Thus, the state machine internal count may be corrected at the end of each group of n phase measurement intervals by a count greater than one, the size of the correction depending upon the size of the average phase error. This embodiment attains synchronization very quickly, but is proportionately less stable.

In another implementation, the correction derivation logic 330 applies a correction signal representing less than the entire magnitude of the average phase error. Such an attenuated correction may be obtained, for example, by using only the m least significant bits of the cumulative phase error from the register 330.

In the preferred implementation of the embodiment of FIG. 3, the state machine internal count is corrected (incremented or decremented) by only a single count regardless of the magnitude of the cumulative phase error. This provides the greatest stability. In this implementation, the correction derivation logic is simply a connection to the sign bit of the cumulative phase error register 330. In those cases in which the actual phase error magnitude is one count, a single correction will result in a total correction of the error, while in other cases in which the actual phase error magnitude exceeds one count, the correction is only partial and removal of the error requires more than one correction cycle.

Feedback of Residual Phase Error

Figure 4:
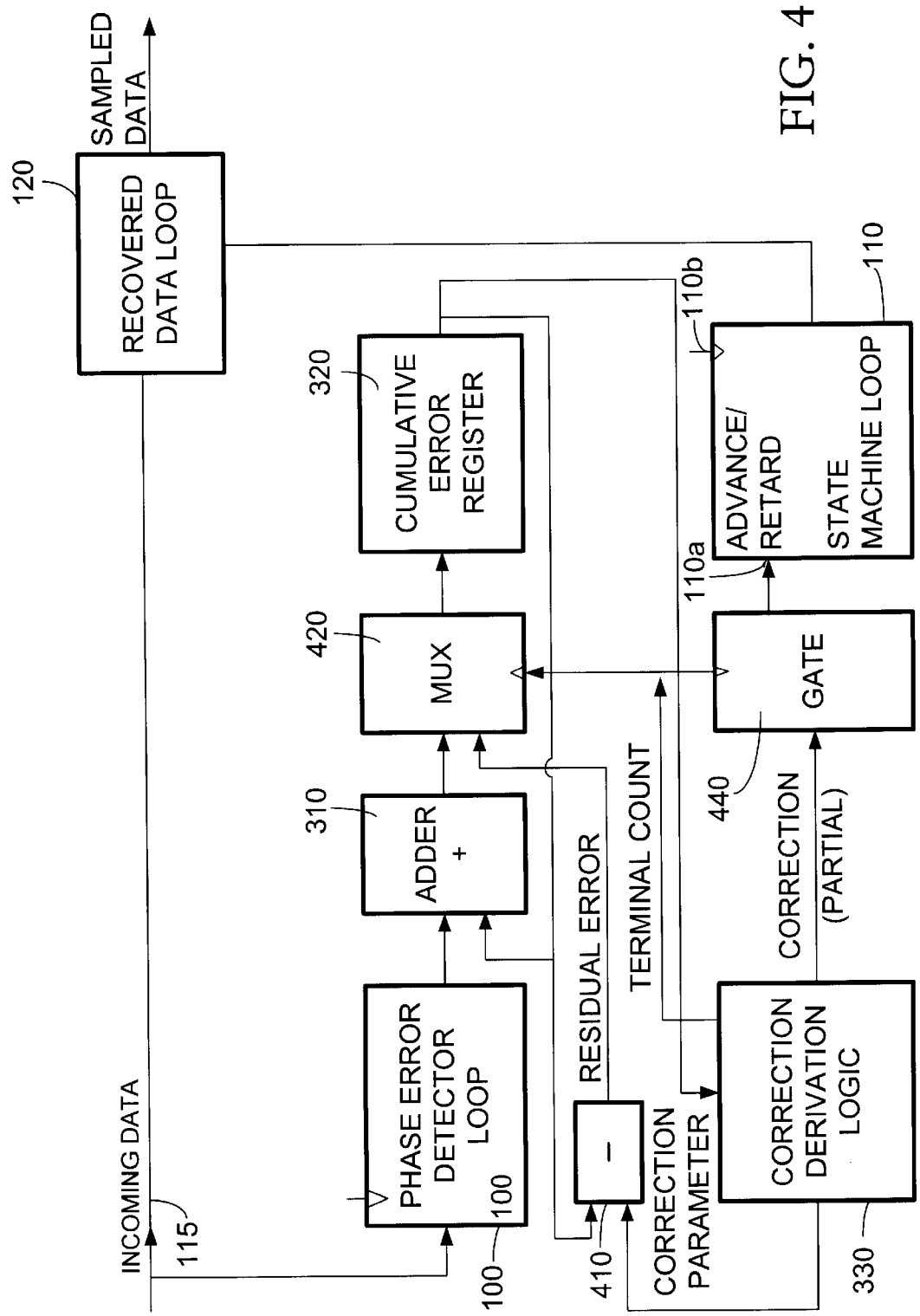
FIG. 4 is a simplified block diagram illustrating a third embodiment of the invention in which a residual phase error is computed following a partial correction to the PLL, and is then fed back into the next correction.

FIG. 4 illustrates an improved version of the embodiment of FIG. 3 in which phase error remaining after a partial correction at the end of one group of n phase error measurement intervals is fed back to the cumulative phase error register for use during the computation of the cumulative phase error during the next group of n phase error measurement intervals. FIG. 2 illustrates two successive groups of n phase measurement intervals for n=2. The number n may be any suitable integer greater than one, including 2, 4, 8, 16, 32, for example. In FIG. 4, the correction derivation logic 330 provides a correction parameter—such as the partial correction magnitude and sign—to one input of a subtractor 410, while the output of the cumulative phase error register 320 is applied to the other input of the subtractor 410. The difference computed by the subtractor is the residual phase error remaining after the partial correction. A multiplexer 420 applies the output of the adder 310 to the input of the cumulative phase error register, except when briefly (for one clock period) enabled by a terminal count signal illustrated in FIG. 2 that occurs at the end of each group of n measurement intervals. When thus enabled by the terminal count signal, the multiplexer 420 selects, instead, the output of the subtractor 410 for input to the cumulative phase error register 320. As a result, at the end of each group of n phase measurement intervals, the cumulative phase error register 320 is not reset to zero but is instead reset to the value of the phase error remaining after the latest correction to the state machine internal count, i.e., the residual phase error. The terminal count also enables a gate 440 connected between the correction derivation logic 330 and the ADVANCE/RETARD input 110a of the state machine. The gate 440 ensures that a correction is applied to the state machine loop 110 only at the end of each group of n phase error measurement intervals. In the preferred embodiment described in greater detail later in this specification, it will be seen that the function of the gate 440 is realized in a multiplexer inside the state machine control loop 110.

By thus intelligently starting each cumulative phase error computation at the residual error level rather than zero, the information available from the previous computation is exploited so that the PLL is given a "head start" at the beginning of each computation, to reach a more accurate phase error result with each computation. As a result, the PLL is less susceptible to jitter-induced error. Moreover, with such a head start at the beginning of each computation, the PLL can converge more quickly toward synchronization with the incoming signal.

Dynamically Programmed Correction Rate

Figure 5:
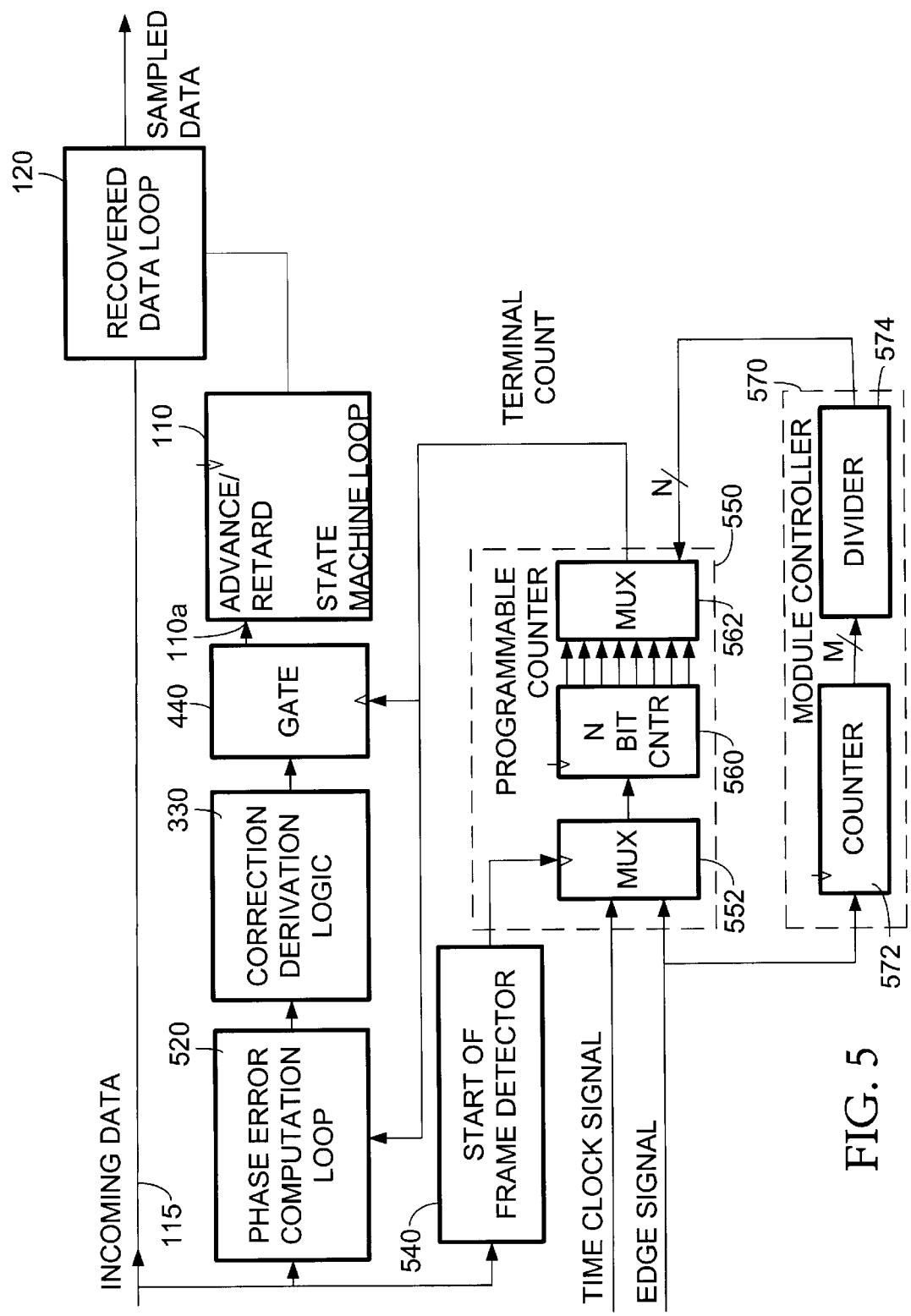
FIG. 5 is a simplified block diagram illustrating a fourth embodiment of the invention employing dynamically programmed correction intervals for updating the PLL.

FIG. 5 illustrates a fourth embodiment of the invention in which a digital PLL corrects its state machine at a rate which is dynamically varied in a manner that optimizes performance. A programmable counter 550 provides a way of varying the period between terminal count pulses applied to the gate 440. The PLL illustrated in FIG. 5 includes a phase error computation loop 520. In a simple implementation similar to that of FIG. 1, the phase error computation loop 520 may include only the phase error detection loop 100, while in a preferred implementation corresponding to the PLL of FIG. 4, it further includes the cumulative phase error register 320, the adder 310, the multiplexer 420 and the subtractor 410.

In FIG. 5, a start-of-frame detector 540 senses whether a start of frame delimiter data pattern has been received yet. Such a pattern separates the preamble of each data block, during which synchronization must be attained, from the later data-containing portion of the data block. A programmable counter 550 generates the terminal count signal controlling the rate at which the state machine loop 110 is corrected. The programmable counter 550 produces the terminal count based upon the number of edges in the received data signal until it receives a signal from the detector 540 indicating the arrival of the start-of-frame delimiter pattern. Thereafter, the programmable counter 550 bases the terminal count interval upon time only, ignoring the number of edges in the received signal. For this purpose, a multiplexer 552 of the programmable counter 550 controlled by the detector 540 selects, for a time base input, between an edge signal from an edge detector and a clock count signal.

Figure 6:
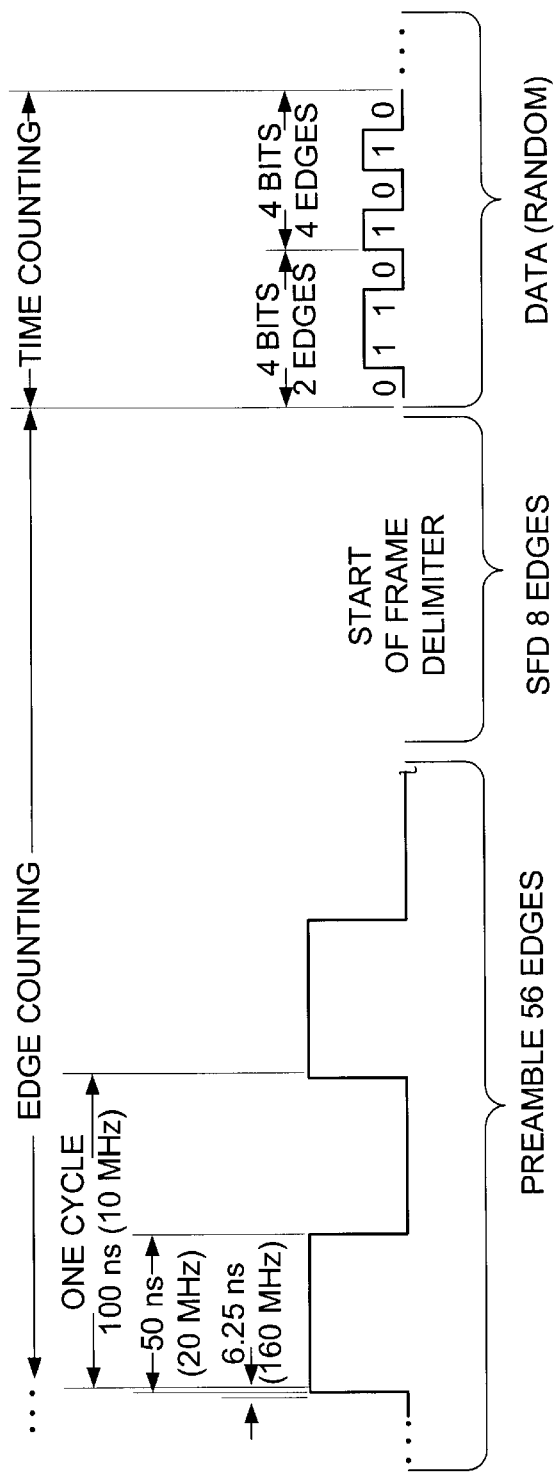
FIG. 6 is a timing diagram illustrating operation of the dynamically programmed correction intervals in the embodiment of FIG. 5.

The advantage of such a feature may be understood by referring to the time domain waveforms of FIG. 6. FIG. 6 illustrates a typical block of received 10 MHz Manchester-encoded data that includes a preamble consisting of a succession of about twenty-eight 100 -nS pulses, followed by a start-of-frame delimiter (SFD), which in turn is followed by the data. The SFD has a unique pre-determined bit pattern known to the SFD detector 540. The data that follows the SFD contains information of any type and therefore contains random bit patterns. It is the data that must be received without error. Therefore, the PLL must achieve synchronization with the data block before the end of SFD and preferably before the SFD. Since there are only twenty-eight pulses in the preamble, the PLL has only fifty-six edges with which to attain synchronization. Therefore, each of these edges must be exploited before SFD in making successive corrections to the state machine internal count. Thus, prior to SFD, the embodiment of FIG. 5 synchronizes the terminal count (defining the rate at which computations are made) with the incoming edges. A phase error is detected with each edge and the corrections are applied very frequently, as often as once every edge. This maximizes the probability that the PLL will attain synchronization with the new data block prior to SFD. Such frequent correction, however, reduces the stability of the PLL, but this is a necessary trade-off in order to attain synchronization quickly.

After SFD, synchronization has been attained. Since the data sample point is now near the center of each pulse, jitter is no longer as great a problem as it was prior to synchronization. The remaining problem is to guard against frequency drift. Frequency drift produces relatively slow changes in the incoming data signal, compared to the fast instabilities produced by jitter before the PLL attains synchronization. Therefore, there is no need to compromise stability after SFD by frequent corrections. Therefore, it is desirable to perform corrections after SFD at a uniform but slower rate. This is not possible if the terminal count is based on edges, since the edge rate of random data can vary by as much as a factor of two. This is illustrated in FIG. 6 illustrating a first sequence of four bits of 0, 1, 1, 0 that has only two edges, and a second sequence of four bits of 1, 0, 1, 0 that has four edges. To avoid such a large fluctuation, the invention switches the base upon which the terminal count signal is generated from received edges to time.

In accordance with another aspect of the embodiment of FIG. 5, the terminal count rate, i.e., the frequency at which corrections are made to the state machine internal count, may be reduced progressively during the preamble. The advantage is that as the end of the preamble is reached, the PLL is approaching synchronization and the closer it reaches synchronization, the smaller the phase error and the less often the corrections need to be made. Thus, the stability of the PLL may be enhanced by slowing down the rate of correction during the preamble. At the beginning of the preamble, the correction rate would be very high. For example, in the preferred embodiment the terminal count signal occurs (and the state machine internal count is updated) every group of n phase measurement intervals, as illustrated in FIG. 2. However, as successive edge are received, the phase error is reduced, on the average, and the interval between terminal counts may be increased accordingly. The embodiment of FIG. 5 accomplishes this using a predetermined schedule of terminal count intervals. For example, the terminal count interval increases with the edge count. This may be accomplished using suitable logic circuitry.

In the implementation illustrated in FIG. 5, the change in the terminal count or correction interval during the preamble is accomplished using a N-bit counter 560 connected to the output of the multiplexer 552, the output of the N-bit counter being connected to an N-bit input multiplexer 562 whose output provides the terminal count signal. The multiplexer selects a progressively more significant output bit of the N-bit counter as the terminal count as the number of received edges in the data signal increases. This in effect progressively increases the modulus of the programmable counter 550, thus reducing the terminal count rate as desired. For this purpose, for example, a modulus controller 570 includes a counter 572 receiving the edge signal, the output of the counter controlling the multiplexer 562 so that the multiplexer chooses a progressively more significant output bit of the counter 560 for the terminal count signal as the edge count maintained by the counter 572 increases. In order to achieve a desired conversion between edge count and terminal count rate, a divider 574 divide the edge count by a desired factor.

Figure 7:
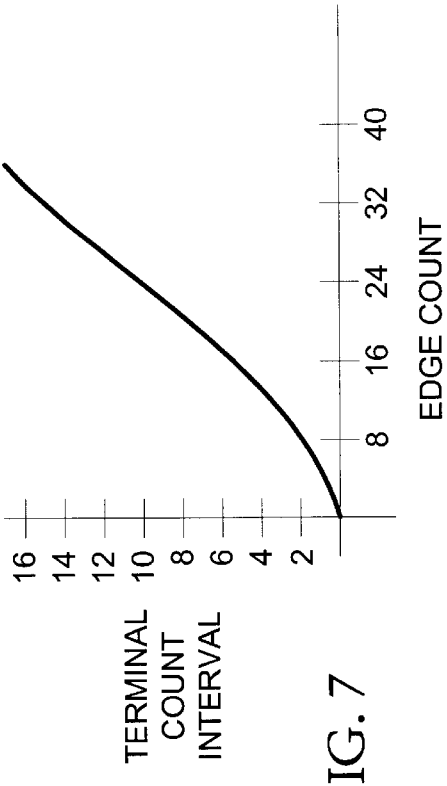
FIG. 7 is a graph illustrating how in the embodiment of FIG. 5 the terminal count interval or correction interval may progressively increase as the edge count increases during the preamble of the received data signal.

The result is that the terminal count interval increases as the edge count increases during the preamble, as illustrated in FIG. 7. For example, the parameters of the system may be selected so that every eight edge counts the terminal count interval doubles.

Preferred Embodiment of the Invention

Figure 8A:
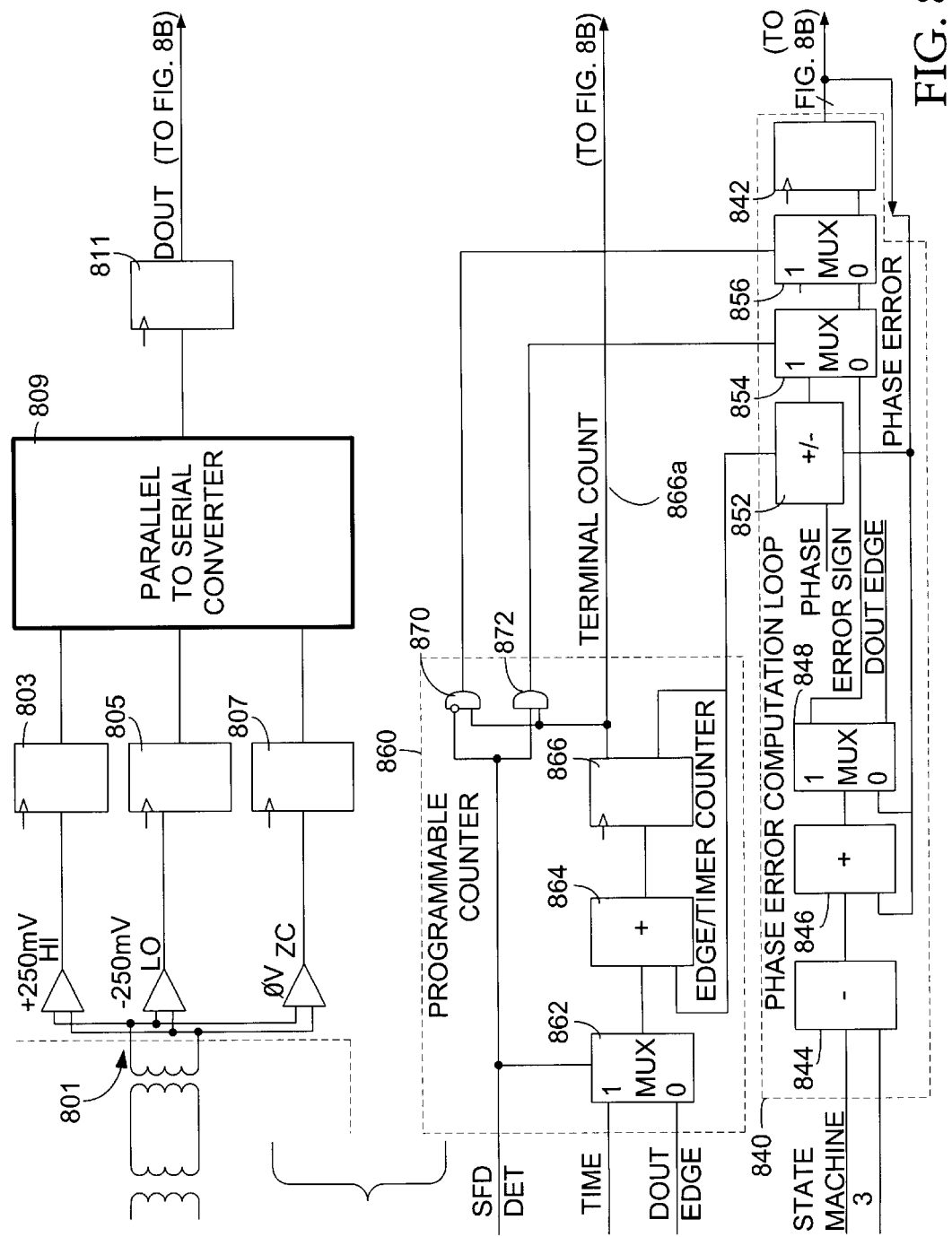
FIG. 8 is a block diagram of a system of the invention combining the four embodiments of FIGS. 1, 3, 4 and 5.
Figure 8B:
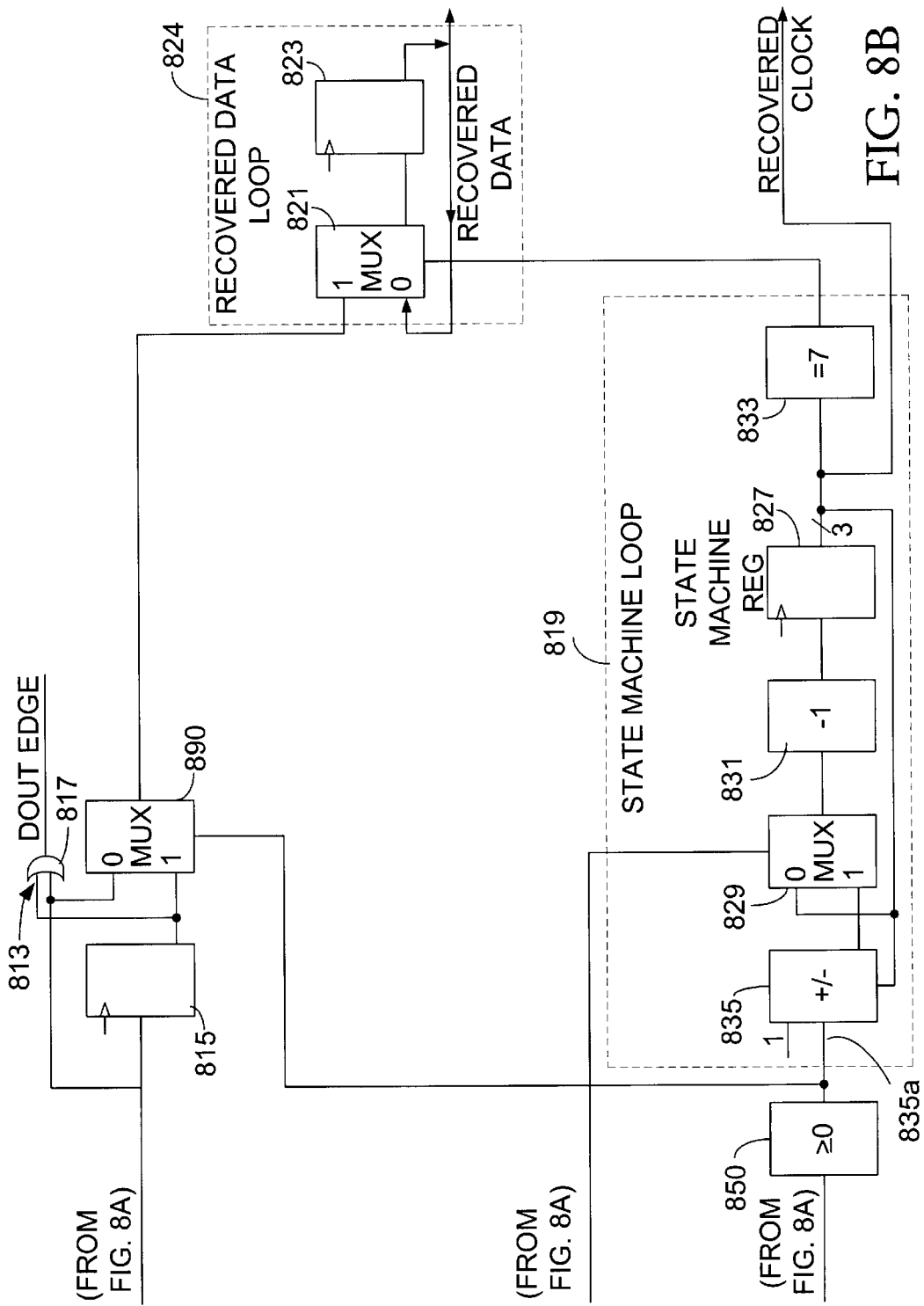

FIG. 8 illustrates the preferred embodiment of a phase lock the invention, which is a PLL including the four embodiments of FIGS. 1, 3, 4 and 5.

(1) Conversion to a Serial Bit Stream:

The incoming data stream is received on a coaxial cable which may be 100 meters long, for example. At the PLL's input terminal 801, three comparators are connected across the inner and outer conductors of the cable 801, namely a HI comparator 803, a LO comparator 805 and a ZC (zero crossing) comparator 807. The HI comparator 803 has an output that is a logic high whenever the voltage of the received data signal exceeds +250 mV, the LO comparator 805 has an output that is a logic high whenever the voltage of the received data signal falls below −250 mV while the ZC comparator 807 has an output that is a logic high whenever the voltage of the received data signal is a small voltage (±5 V) near zero volts. A conventional parallel-to-serial converter 809 converts the parallel logic outputs of the comparators 803, 805, 807 into a serial stream of logic bits representing the series of pulses contained in the received data signal. A flip flop 811 synchronized by the internal clock signal of the PLL delays the serial bit stream from the converter 809 by one clock period. As described above, for a 20 MHz incoming data stream to be sampled at eight times per pulse, the PLL's internal clock signal must have a clock frequency of 160 MHz, so the flip flop 811 produces a delay of 6.25 nS. An edge detector 813 consists of a delay flip flop 815 and an XOR gate 817. The XOR gate's two inputs are connected to the input and output, respectively of the delay flip flop 815, so that the output of the XOR gate 817 (DOUT EDGE) is a logic high only during a 6.25 nS clock period in which there is a transition in the serial bit stream. Such a transition corresponds to an edge in the received waveform, such as the leading edge 200a of FIG. 2.

(2) Sampling Control by the State Machine:

A state machine loop 819 controls the sampling of the serial bit stream at a sampling multiplexer 821 with a delay flip flop 823 that together form a recovered data loop 824. The control input of the multiplexer is connected to the output of the state machine loop 819. Each sample circulates in the recovered data loop 824 from the output of the flip flop 823 to one input of the multiplexer 821. Normally, the multiplexer 821 selects this one input and sends it on to the input of the flip flop 823, so that the sample continues to circulate in the loop 824. However, whenever the output of the state machine loop 819 goes high, the multiplexer 821 selects its other input. This other input is the serial bit stream from the parallel-to-serial converter 809. This introduces the next sample into the loop 824, so that the new sample appears at the output of the flip flop 823 after one clock period. The output of the flip flop 823 is the recovered data from the PLL.

(3) Operation of the State Machine Loop:

The state machine loop 819 includes a 3-bit state machine register 827 containing the current internal count of the state machine. The state machine register's output is fed back through a multiplexer 829 to a −1 subtractor 831 whose output is applied to the state machine register's input. The state machine register 827 is enabled by the PLL internal clock signal, so that the state machine register contents continually counts down in a cycle of modulus 8 in synchronism with the PLL's internal clock signal. Thus, with each 6.25 nanosecond clock period, the contents of the state machine register 827 progresses as follows: 7, 6, 5, 4, 3, 2, 1, 0, 7, 6, 5, . . . etc. In the embodiments described above in this specification, count 7 and count 6 are nearest the center of each pulse after synchronization, and count 7 is selected as the nominal count for sampling the bit stream. Preferably, therefore, the output of the state machine loop 819 is high during count 7. For this purpose, a logic circuit 833 connected to the 3-bit output of the state machine register 827 issues a logic high at the state machine loop output whenever the state machine count is seven, thus enabling the recovered data loop's multiplexer 821 to select the next data sample as described.

The state machine loop's multiplexer 829 controls the corrective updating of the state machine count. Its control input is connected to the terminal count signal, whose origin will be described below. As described above, the default-selected input of the multiplexer 829 is the feedback from output of the state machine register 827. Its actively-selected input is connected to the output of an adder/subtractor 835. A control input 835a, that determines whether the adder/subtract 835 adds or subtracts, receives the cumulative phase error sign bit, whose origin will be described below. The output of the state machine register 827 is fed back to the input of the adder/subtractor 835, which adds or subtracts one from the input depending upon the cumulative phase error sign bit. Upon the occurrence of a logic high in the terminal count signal, the multiplexer 829 selects the output from the adder/subtractor 835. As a result, the subtractor 831 subtracts one from a terminal count that has been corrected by ±1 depending upon the phase error sign bit, so that a corrected count is then loaded into the state machine register 827.

(4) Phase Error Computation Loop:

The PLL of FIG. 8 further includes a cumulative phase error computation loop 840, which performs accumulation of successive phase errors and the feedback of the residual phase error described above with reference to FIG. 4. It further performs the dynamic programming of the correction rate described above with reference to FIG. 5. The accumulation of the phase error corresponding to the embodiment of FIG. 3 will now be described first.

The cumulative phase error is stored in a phase error register 842. The phase error is computed by a subtractor 844 having a first input connected to the 3-bit output of the state machine register 827 and a second input constantly set to the state machine count at which each edge is supposed to align (i.e., 3 in the preferred embodiment). The contents of the phase error register 842 is fed back to one input of an adder 846 and a default-selected input of a multiplexer 848. The actively-selected input of the multiplexer 848 is connected to the output of the adder 846. The adder 846 adds the phase-error computed by the subtractor 844 to the cumulative phase error from the register 842. The multiplexer 848 is enabled by the DOUT EDGE signal from the edge detector XOR gate 817. Upon the occurrence of each edge in the received data signal (coinciding with the DOUT EDGE signal), the output of the subtractor 844 is the instantaneous phase error. At this time, the multiplexer 848 sends the sum (computed by the adder 846) of the instantaneous phase error and the prior contents of the phase error register 842 to the input of the phase error register 842, thus adding the current phase error to the cumulative total. Otherwise, during those clock periods in which no edges occur, the contents of the phase error register 842 recirculates from the register output to the register input without alteration through the default-selected input of the multiplexer 848.

A logic circuit 850 extracts the sign bit of the phase error register and applies to the control input 835*a* of the adder/subtractor 835 of the state machine loop 819. The logic circuit 850 corresponds to the correction derivation logic 330 of FIGS. 3 and 4. The control input 835*a* corresponds to the ADVANCE/RETARD state machine loop input 110*a* of FIGS. 1, 3 and 4.

The phase error computation loop 840 further includes elements which compute the residual phase error after each correction of the state machine count and initialize the phase error register 842 to the residual phase error, as in the embodiment of FIG. 4. These elements include an adder/subtractor 852 having one input connected to the output of the phase error register 842 and its other input connected to receive the current edge count from an edge counter discussed below. The phase error register sign bit is connected to the control input of the adder/subtractor 852 so that the adder/subtractor 852 either adds or subtracts the current edge count from the cumulative phase error depending upon the sign of the error. The resulting difference is the residual phase error, as will be discussed below with reference to FIG. 9. This residual phase error phase error is applied to the actively-selected input of a multiplexer 854. The default-selected input of the multiplexer 854 is connected to the output of the multiplexer 848. The control input of the multiplexer 854 is connected to a version of the terminal count signal that is enabled only during the preamble, as will be described below. As a result, in the absence of the terminal count signal, the phase error register 842 is updated with the cumulative phase error as described above. However, upon assertion of the terminal count signal, the multiplexer applies the residual phase error from the adder/subtractor 852 to the phase error register input. This coincides with the correction of the state machine count, so that the phase error register 842 is re-initialized for the next computational cycle to the residual phase error rather than to zero.

After the preamble or after the occurrence of SFD, the multiplexer 854 is no longer enabled at each terminal count, and control over resetting the phase error register 842 passes to another multiplexer 856. The default-selected input of the multiplexer 856 is connected to the output of the multiplexer 854, while the actively-selected input of the multiplexer 856 is constantly held at a value of zero. The enable input of the multiplexer 856 is connected to a version of the terminal count signal that is enabled only after SFD. Thus, after the preamble (after SFD), the phase error register 842 accumulates the phase error over successive edges. Then, upon the assertion of the terminal count signal, the multiplexer sends the zero value at its actively-enabled input to the phase error register 842 so that the phase error register is reset to zero at the same time the state machine count is corrected.

(5) Programmable Counter:

The PLL has a programmable counter 860 which generates the terminal count signal and enables the multiplexer 854 before SFD and the multiplexer 856 after SFD. The programmable counter 860 includes a multiplexer 862 having one input connected to the DOUT EDGE signal from the XOR gate 817 and another input connected to a time base signal derived from the PLL's internal clock. The control input of the multiplexer 862 is connected to the output of the SFD detector 540 of FIG. 5 so that the multiplexer 862 outputs the DOUT EDGE signal during the preamble (i.e., prior to SFD) and outputs the time base signal after the preamble (after SFD).

The output of the multiplexer 862 is applied to one input of an adder 864, whose output is applied to the input of an 8-bit terminal count register 866. The output of the terminal count register 866 is applied to the other input of the adder 864. The terminal count register is synchronized with the PLL internal clock signal. Each time the output of the multiplexer 862 goes high (due to the occurrence of a pulse in either the DOUT EDGE signal or the time base signal, depending upon whether SFD has occurred), the adder 864 increments the terminal count register 866 by one.

The length of the terminal count is determined by selecting one of the output bits of the terminal count register 866 as the terminal count signal. The least significant bits of the terminal count register 866 that include the selected output (terminal count) bit will automatically reset to zero the next clock signal period after the terminal count is reached. Therefore, prior to SFD, the contents of the terminal count register 866 at terminal count is the number of edges received between terminal counts. As described previously herein, it is this quantity that must be applied to one input of the adder/subtractor 852 in order to computer the residual phase error. Therefore, the output of the terminal counter register 866 is applied to the one input of the adder/subtractor 852.

Why the subtraction performed by the adder/subtractor 852 of the number of edges between terminal counts from the cumulative phase error produces the residual phase error is now explained with reference to the chart of FIG. 9. In FIG. 9, an example is tabulated in which one correction cycle (the interval between terminal counts) spans two 50 nS pulse widths, so that the state machine count goes through two cycles in this interval. Furthermore, in the example of FIG. 9, an edge is detected during the first state machine cycle at count 5, which is an instantaneous phase error of +2, and the next edge is detected during the second state machine cycle at count 4, which is an instantaneous phase error of +1. At the end of the first state machine cycle at count 3, since there was no prior phase error the cumulative phase error is +2. At the end of the second state machine cycle at count 3, the cumulative phase error increases to +3. This is greater than the actual phase error at this instant because +3 is an accumulation of more than one error. For example, if the error stayed constant, the cumulative error would still increase. In fact, the cumulative error that can be corrected is only one count per edge in the embodiment of FIG. 8. Since there are two edges in each terminal count interval in this example, the remaining or residual error is obtained by subtracting the number (2) of edges in the terminal count interval from the cumulative error. Subtracting the number of edges per correction cycle or terminal count interval (i.e., 2) from the cumulative phase error (3) leaves a residual phase error of 1 at the end of the terminal count interval.

The terminal count signal is obtained from a selected one 866a of the eight output bits of the counter 866, depending upon the desired interval of the terminal count signal. This selection may be dynamically varied during the preamble as successive edges are received in the manner describe above with reference to FIG. 5.

The terminal count signal from the counter output bit 866a is applied directly to the control input of the multiplexer 829 of the state machine loop 819 as described above. The terminal count signal is also applied to inputs of AND gates 870 and 872 which control the multiplexers 854 and 856 respectively. The other input of the AND gate 872 receives the SFD detector output while the other input of the AND gate 870 receives an inverted version of the SFD detector output. Prior to SFD, the AND gate 870 enables the multiplexer 854 each time the terminal count signal is asserted but not after SFD. After SFD, the AND gate 872 enables the multiplexer 856 each time the terminal count signal is asserted but not before SFD. The function of the multiplexers 854 and 856 has already been described.

(6) Phase-Directed Sample Selection:

Phase-directed sample selection of the type described above with reference to FIG. 1 is provided by a multiplexer 890 having one input connected to the input connected to the input of the delay flip flop 815 and its other input connected to the output of the delay flip flop 815. The phase error register sign bit from the logic 850 is applied to the control input of the multiplexer 890 to select either a delayed sample or an undelayed sample depending upon the sign bit of the cumulative phase error.

While the invention has been described in detail by specific reference to preferred embodiments, it is understood that variations and modifications thereof may be made without departing from the true spirit and scope of the invention.

What is claimed is:

1. A digital phase lock loop (PLL) having an internal PLL clock for synchronization with a received data signal of pulses having a maximum pulse edge rate, including a preamble and an information-containing data frame, said internal PLL clock having a clock rate about M times said pulse edge rate to define M successive samples of each one of said pulses, said PLL comprising:

a state machine having an internal cyclic count of modulus M incremented in synchronism with said internal PLL clock, and a control input for updating said internal cyclic count, each cycle of said internal cyclic count including a center count value and an edge count value;

sampling logic connected to receive said data signal and having a sampling control input connected to an output of said state machine, said sampling logic selecting a current one of said M successive samples when said internal count reaches the center count value;

an edge detector responsive to said data signal;

an error detector for sampling said internal count from said state machine in synchronism with said edge detector whereby to sense a phase error between the time of occurrence of a current one of said successive edges and the time of occurrence of said edge count value of said internal count;

a cumulative phase error register;

an adder for summing the contents of said cumulative phase error register with each successive phase error sensed by said error detector and inputting the resulting sum into said cumulative phase error register, whereby to store in said cumulative phase error register a cumulative phase error of a plurality of N phase errors summed over N edges of said data signal;

a terminal counter having a cyclic count of modulus T for counting by a time base comprising a selected one of: (a) edges sensed by said edge detector and (b) a time-based signal, said terminal counter providing a terminal count signal which is asserted whenever said cyclic count of said terminal counter counts through said modulus T;

correction logic for applying a correction signal derived from the contents of said cumulative phase error register to said correction input of said state machine and for enabling said correction input of said state machine upon assertion of said terminal count signal, whereby the period of said terminal count signal determines the number N of said plurality of phase errors., so that successive cumulative phase errors are computed and corresponding corrections made to said internal count periodically;

reset logic for resetting said cumulative phase error register upon assertion of said terminal count signal; and a time-base selector for selecting said edges as the time base during said preamble and for selecting said time-based signal as the time base during said data frame.

2. The digital PLL of claim 1 further comprising:

residual error logic for computing from said the number N of said plurality of phase errors and from said cumulative phase error a residual phase error remaining after application of the correction signal to said control input of said state machine; and wherein said reset logic resets said cumulative phase error register upon assertion of said terminal count signal to one of: (a) a current value of said residual phase error upon assertion of said terminal count signal, (b) zero.

3. The digital PLL of claim 2 further comprising a program logic element controlling said reset logic in response to said time base selector whereby said reset logic resets said cumulative phase error register (a) to said current value of said residual phase error during said preamble and (b) to zero during said data frame.

4. The digital PLL of claim 1 wherein the rates of said time-based signal and said edges are such that the period of said terminal count signal is shorter during said preamble than during said data frame.

5. The digital PLL of claim 4 wherein said the period of said terminal count signal during said preamble corresponds to the number N of said plurality of phase errors on the order of 2 and during said data frame is of a constant time duration and corresponds to a larger value of N that varies depending upon the contents of the data frame.

6. The digital PLL of claim 5 wherein said terminal counter is a programmable counter wherein said modulus T is variable, said terminal counter comprising:

modulus update logic for incrementing said terminal count modulus T over successive terminal count periods.

7. The digital PLL of claim 5 wherein said modulus update logic has an enable input connected to said program logic element whereby said modulus update logic is disabled during said data frame.

8. The digital PLL of claim 7 wherein the number N of edges in successive terminal count intervals during said preamble doubles with each successive terminal count beginning at 2.

9. The digital phase lock loop of claim 1 wherein said correction output signal is a sign bit of said cumulative phase error register.

10. The digital PLL of claim 9 wherein:
said control input of said state machine is capable of changing said internal count by no more than +/−1.

11. The digital PLL of claim 10 wherein said residual error logic comprises a counter for counting the number of edges over which a cumulative phase error is computed and a subtractor for subtracting the number of edges from said cumulative phase error and outputting the resulting difference as said residual phase error.

12. The digital PLL of claim 2 wherein said correction signal is a function of the magnitude and sign of said cumulative phase error, and wherein said residual logic computes said residual phase error based upon the magnitude of said correction signal.

13. The digital PLL of claim 1 wherein said edge detector comprises:
a delay flip flop connected to a data signal input of said sampling logic;
a detection logic gate comprising a pair of inputs connected, respectively, to the input and output of said delay flip flop, said logic circuit having an output which is asserted whenever a logic difference exists between said two inputs of said logic circuit.

14. The digital PLL of claim 1 wherein:
said sampling logic comprises a multiplexer having a default-selected input, an active-selected input, a multiplexer output and a multiplexer control input comprising said sampling control input;
said default-selected input and said multiplexer output are connected in a feedback loop;
said active-selected input is connected to receive the selected sample from said selective delay element, whereby the current sample selected by said sample selection logic replaces a previous sample in said feedback loop whenever said internal count reaches said center count value.

15. The digital PLL of claim 14 further comprising a delay flip flop synchronized with said PLL clock connected in said loop between said default-selected input and said multiplexer output.

16. The digital PLL of claim 1 wherein M=8.

17. The digital PLL of claim 1 wherein said correction output signal received by said state machine comprises a sign bit of said cumulative phase error and at least a portion of said magnitude of said cumulative phase error, whereby said state machine internal count is corrected in proportion to said magnitude of said cumulative phase error.

18. A method of synchronizing a digital circuit with the phase of a received data signal including a preamble and an information-containing data frame, said data signal comprising successive pulses having a pulse edge rate, said digital circuit having an internal PLL clock with a clock rate about M times said pulse edge rate to define M successive samples of each one of said successive pulses, said method comprising:
incrementing a state machine through an internal cyclic count of modulus M in synchronism with said internal PLL clock, corresponding to M successive samples of each one of said successive pulses, said internal cyclic count including:
(a) a predetermined center count value tending to coincide with center regions of said successive pulses, and
(b) a predetermined edge count value tending to coincide with edges of the successive pulses;
selecting a current one of said M successive samples whenever said internal count reaches the predetermined center count value;
sensing receipt of said edges of said successive pulses, and producing for each edge a phase error between the time of occurrence of the edge and the time of occurrence of said edge count value of said internal count;
summing the phase errors of at a number N of successive edges to compute a cumulative phase error over the N edges of said data signal,
incrementing cyclic count of modulus T in synchronism with a selected one of: (a) said edges and (b) a time-based signal,
asserting a terminal count signal whenever said cyclic count through said modulus T and correcting said internal count of said state machine in synchronism with said terminal count signal with a correction derived from said cumulative phase error, whereby a terminal count interval between successive terminal count signals determines said number N of edges;
selecting said edges as the time base of said cyclic count of modulus T during said preamble and selecting said time-based signal as the time base during said data frame.

19. The method of claim 18 further comprising:
with a successive assertion of said terminal count signal:
(a) computing a residual phase error of said internal count remaining after the correcting thereof,
(b) resetting said cumulative phase error to the value of said residual phase error.

20. The method of claim 18 wherein the resetting of said cumulative phase error to said residual phase error is performed during said preamble but not during said data frame, said method further comprising:
during said data frame, resetting said cumulative phase error to zero upon assertion of the terminal count signal.

21. The method of claim 18 wherein the rates of said time-based signal and said edges are such that said terminal count interval is shorter during said preamble than during said data frame.

22. The method of claim 21 wherein said terminal count interval during said preamble corresponds to a value of N on the order to 2 and during said data frame is of a constant time duration and corresponds to a larger value of N that varies depending upon the contents of the data frame.

23. The method of claim 22 further comprising:
incrementing said terminal count modulus T over successive terminal count intervals.

24. The method of claim 23 wherein the incrementing of said terminal count modulus T is performed during said preamble but not during said data frame.

25. The method of claim 24 wherein said incrementing comprises doubling said terminal count modulus T every terminal count interval.

26. The method of claim 18 wherein:
said correction value is ±1 depending upon the sign of said cumulative phase error; and
the computing a residual phase error comprises subtracting the number of edges between corrections from said residual phase error.

27. The method of claim 18 wherein:
the correcting of said internal count constitutes changing said internal count by only a correction value of +/−1; and said correction value corresponds to the sign bit of said phase difference.

28. The method of claim 18 wherein M=8.

29. The method of claim 18 wherein said correction value corresponds to the magnitude and sign of said cumulative phase error.

30. The method claim 18 wherein said correction value corresponds to the sign and a portion of the magnitude of said cumulative phase error.

31. A digital phase lock loop (PLL) having cumulative phase error correction, said PLL having an internal PLL clock and comprising:

a state machine having an internal count cycle of modulus M incremented in synchronism with said internal PLL clock and a control input for updating said internal count cycle, said count cycle of modulus M corresponding to M successive samples of each one of said successive pulses, each cycle of said count cycle including a center count value and an edge count value;

sampling logic responsive to said state machine for sampling a current one of said pulses during one predetermined count of said internal count cycle, said sampling logic selecting a current one of said M successive samples when said internal count reaches said center count value;

a phase error detector detecting a phase difference between the time of occurrence of at least one of said successive edges and the time of occurrence of said one predetermined count;

a cumulative phase error register which receives said phase difference which accumulates a cumulative phase error of phase differences summed over a selectable interval containing a number N of said edges, said cumulative phase error corresponding to a correction output signal;

a correction circuit responsive upon accumulation of a predetermined number N of phase errors for applying said correction signal corresponding to said cumulative phase error to said control input of said state machine; and control logic for determining said selectable interval by: (a) counting the number of said edges up to said number N during said preamble and (b) setting said interval to a constant time period during said data frame whereby the number N of edges in successive intervals varies depending upon the contents of the data frame.

32. The digital PLL of claim 22 further comprising:

program logic operable during said preamble for varying said number N of edges in each said interval.

33. The digital PLL of claim 23 wherein said program logic comprises logic for increasing said number N over successive intervals.

34. The digital PLL of claim 24 wherein the number N doubles every interval.

35. The digital PLL of claim 22 further comprising:

residual error logic for computing from said number N and from said cumulative phase error a residual phase error remaining after application of a correction signal to said control input of said state machine; and reset logic for resetting said cumulative phase error register to a current value of said residual phase error whenever said correction output signal is applied to said state machine, whereby successive cumulative phase errors are computed and corresponding corrections made to said internal count periodically.

36. The digital phase lock loop of claim 22 wherein said correction output signal is a sign bit of said cumulative phase error.

37. The digital PLL of claim 27 further comprising an edge detector for producing an edge signal to said edge input of said phase error detector, said edge detector comprising:

a delay flip flop connected between said data signal input and said sampling logic;

a detection logic gate comprising a pair of inputs connected, respectively, to the input and output of said delay flip flop, said logic circuit having an output which is asserted whenever a logic difference exists between said two inputs of said logic circuit.

38. The digital PLL of claim 28 wherein said detection logic gate comprises an exclusive OR (XOR) gate.

39. The digital PLL of claim 28 further comprising:

sample delay logic responsive to said sign bit for outputting to said sample selection logic one of: (a) a sample at the input to said delay flip flop, (b) a sample at the output of said delay flip flop, depending upon said sign bit.

40. The digital PLL of claim 30 wherein:

said control input of said state machine is capable of changing said internal count by only +/−1; and said portion of said correction output signal received by said control input of said state machine is said sign bit.

41. In a digital phase lock loop (PLL), a method for attaining and maintaining synchronization with the phase of a received data signal having a preamble and an information-containing data frame, said method comprising:

incrementing a state machine through an internal cyclic count, each cycle thereof including a center count tending to coincide with center regions of the successive pulses and an edge count tending to coincide with edges of the successive pulses;

selecting a current sample of the signal whenever the internal count reaches the predetermined center count value;

updating the state machine internal count in accordance with a cumulative phase error obtained by summing the phase errors detected over successive edges between each edge and the corresponding center count;

during the preamble, determining the interval over which the cumulative phase error is computed in accordance with the number of received edges during the preamble; and during the data frame, determining the interval over which the cumulative phase error is computed in accordance with elapsed time, wherein the interval is shorter during the preamble than during said data frame.

42. The method of claim 32 further comprising:

increasing the number of edges in each interval over successive intervals.

43. The method of claim 33 wherein the step of increasing the number of edges in each interval over successive intervals is performed during said preamble and not during said data frame.

44. The method of claim 32 wherein the step of increasing comprises doubling the number of edges per interval with each successive interval during said preamble, and during the data frame the interval is a constant time duration in which the number of edges depends upon the content of the data frame.

* * * * *